United States Patent
Zhao et al.

(10) Patent No.: US 12,315,724 B2
(45) Date of Patent: May 27, 2025

(54) HELIUM-FREE SILICON FORMATION

(71) Applicant: Applied Materials, Inc., Santa Clara, CA (US)

(72) Inventors: Zeqiong Zhao, Santa Clara, CA (US); Allison Yau, Mountain View, CA (US); Sang-Jin Kim, San Jose, CA (US); Akhil Singhal, Portland, OR (US); Zhijun Jiang, San Jose, CA (US); Deenesh Padhi, Sunnyvale, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 245 days.

(21) Appl. No.: 17/235,222

(22) Filed: Apr. 20, 2021

(65) Prior Publication Data

US 2022/0336216 A1 Oct. 20, 2022

(51) Int. Cl.
*H01L 21/02* (2006.01)
*C23C 16/24* (2006.01)
(Continued)

(52) U.S. Cl.
CPC ........ *H01L 21/02532* (2013.01); *C23C 16/24* (2013.01); *C23C 16/401* (2013.01);
(Continued)

(58) Field of Classification Search
CPC ......... H01L 21/02532; H01L 21/02164; H01L 21/02592; H01L 21/0262; H01L 21/02664;
(Continued)

(56) References Cited

U.S. PATENT DOCUMENTS 5,523,626 A * 6/1996 Hayashi ............ H01L 23/53223
257/765
6,888,252 B2 * 5/2005 Derraa .............. H01L 21/76877
257/E21.585
(Continued)

FOREIGN PATENT DOCUMENTS

CN 101246932 A * 8/2008
CN 105189813 A 12/2015
(Continued)

OTHER PUBLICATIONS

Application No. PCT/US2022/025164, International Search Report and Written Opinion, Mailed On Jul. 28, 2022, 11 pages.

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary deposition methods may include delivering a silicon-containing precursor and an inert gas to a processing region of a semiconductor processing chamber. The methods may include providing a hydrogen-containing precursor with the silicon-containing precursor and the inert gas. The methods may include forming a plasma of all precursors within the processing region of a semiconductor processing chamber. The methods may include depositing a silicon-containing material on a substrate disposed within the processing region of the semiconductor processing chamber. The processing region may be maintained free of helium delivery during the deposition method.

20 Claims, 2 Drawing Sheets

(51) Int. Cl.
*C23C 16/40* (2006.01)
*C23C 16/46* (2006.01)
*C23C 16/50* (2006.01)
*C23C 16/56* (2006.01)
*H01J 37/32* (2006.01)

(52) U.S. Cl.
CPC .............. *C23C 16/46* (2013.01); *C23C 16/50* (2013.01); *C23C 16/56* (2013.01); *H01J 37/32449* (2013.01); *H01L 21/02164* (2013.01); *H01L 21/02592* (2013.01); *H01L 21/0262* (2013.01); *H01L 21/02664* (2013.01); *H01J 2237/332* (2013.01)

(58) Field of Classification Search
CPC ........... H01L 21/02211; H01L 21/0245; H01L 21/02488; H01L 21/02507; H01L 21/02277; H01L 21/02587; C23C 16/24; C23C 16/401; C23C 16/46; C23C 16/50; C23C 16/56; H01J 37/32449; H01J 2237/332

See application file for complete search history.

(56) References Cited

U.S. PATENT DOCUMENTS

| | | | |
|---|---|---|---|
| 8,084,278 B2 * | 12/2011 | Uda | C23C 16/56 438/758 |
| 8,709,551 B2 * | 4/2014 | Fox | H01L 21/02123 427/255.27 |
| 2003/0045081 A1 * | 3/2003 | Lin | H01L 21/28035 257/E29.155 |
| 2012/0142172 A1 * | 6/2012 | Fox | H01L 21/0245 438/488 |
| 2015/0325435 A1 * | 11/2015 | Hollister | H01L 21/02507 438/758 |

FOREIGN PATENT DOCUMENTS

| | | |
|---|---|---|
| JP | 2009044171 A | 2/2009 |
| KR | 20070095989 A | 10/2007 |
| KR | 20150061163 A | 6/2015 |
| TW | 201411722 A | 3/2014 |
| WO | 2018063804 A1 | 4/2018 |

* cited by examiner

HELIUM-FREE SILICON FORMATION

TECHNICAL FIELD

The present technology relates to semiconductor deposition processes. More specifically, the present technology relates to helium-free methods of depositing materials on a substrate.

BACKGROUND

Integrated circuits are made possible by processes which produce intricately patterned material layers on substrate surfaces. Producing patterned material on a substrate requires controlled methods of formation and removal of exposed material. As device sizes continue to shrink, material uniformity may affect subsequent operations. For example, surface roughness of produced materials may affect subsequent etching uniformity. However, conventional processing methods may utilize expensive gases like helium, which are becoming prohibitively expensive to use in semiconductor fabrication.

Thus, there is a need for improved systems and methods that can be used to produce high quality devices and structures. These and other needs are addressed by the present technology.

SUMMARY

Exemplary deposition methods may include delivering a silicon-containing precursor and an inert gas to a processing region of a semiconductor processing chamber. The methods may include providing a hydrogen-containing precursor with the silicon-containing precursor and the inert gas. The methods may include forming a plasma of all precursors within the processing region of a semiconductor processing chamber. The methods may include depositing a silicon-containing material on a substrate disposed within the processing region of the semiconductor processing chamber. The processing region may be maintained free of helium delivery during the deposition method.

In some embodiments, the silicon-containing material may be characterized by an as-deposited surface roughness of less than or about 1 nm. A plasma power may be maintained at less than or about 500 W while forming the plasma of all precursors within the processing region of the semiconductor processing chamber. A substrate temperature may be maintained at greater than or about 400° C. during the depositing the silicon-containing material on the substrate. A pressure may be maintained below or about 10 Torr during the depositing the silicon-containing material on the substrate. The methods may include forming a layer of silicon oxide over the silicon-containing material. The methods may include, subsequent the depositing, performing a thermal anneal of the silicon-containing material. A flow rate ratio of the hydrogen-containing precursor to either of the silicon-containing precursor or the inert gas may be greater than or about 1:1.

Some embodiments of the present technology may encompass deposition method. The methods may include delivering a silicon-containing precursor and an inert gas to a processing region of a semiconductor processing chamber. The methods may include providing a hydrogen-containing precursor with the silicon-containing precursor and the inert gas. A flow rate ratio of the hydrogen-containing precursor to either of the silicon-containing precursor or the inert gas may be greater than or about 1:1. The methods may include forming a plasma of the silicon-containing precursor, the inert gas, and the hydrogen-containing precursor within the processing region of a semiconductor processing chamber. The methods may include depositing a silicon-containing material on a substrate disposed within the processing region of the semiconductor processing chamber.

In some embodiments, the processing region may be maintained free of helium delivery during the deposition method. A plasma power may be maintained at less than or about 500 W while forming the plasma of the silicon-containing precursor, the inert gas, and the hydrogen-containing precursor within the processing region of a semiconductor processing chamber. The methods may include, subsequent the depositing, thermally annealing the silicon-containing material. The silicon-containing material may be characterized by an as-deposited surface roughness of less than or about 0.5 nm. The methods may include, subsequent the depositing, forming a layer of a silicon oxide overlying the silicon-containing material. A plasma power may be maintained at greater than or about 200 W while forming the plasma of the silicon-containing precursor, the inert gas, and the hydrogen-containing precursor within the processing region of the semiconductor processing chamber.

Some embodiments of the present technology may encompass deposition methods. The methods may include delivering a silicon-containing precursor and an inert gas to a processing region of a semiconductor processing chamber. The methods may include providing a hydrogen-containing precursor with the silicon-containing precursor and the inert gas. The methods may include forming a plasma of all precursors within the processing region of a semiconductor processing chamber. The methods may include depositing a silicon-containing material on a substrate disposed within the processing region of the semiconductor processing chamber. The processing region may be maintained free of helium delivery during the deposition method. The methods may include providing an oxygen-containing precursor. The methods may include depositing an oxygen-containing material on the substrate.

In some embodiments, a flow rate ratio of the hydrogen-containing precursor to either of the silicon-containing precursor or the inert gas is greater than or about 1:1. The methods may include, prior to providing the oxygen-containing precursor, halting a flow of the hydrogen-containing precursor. The silicon-containing material may be characterized by an as-deposited surface roughness of less than or about 1 nm. A plasma power may be maintained at less than or about 500 W while forming the plasma of all precursors within the processing region of the semiconductor processing chamber.

Such technology may provide numerous benefits over conventional systems and techniques. For example, the processes may produce films characterized by reduced surface roughness compared to conventional techniques. Additionally, the operations of embodiments of the present technology may produce improved mask materials while utilizing helium-free processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
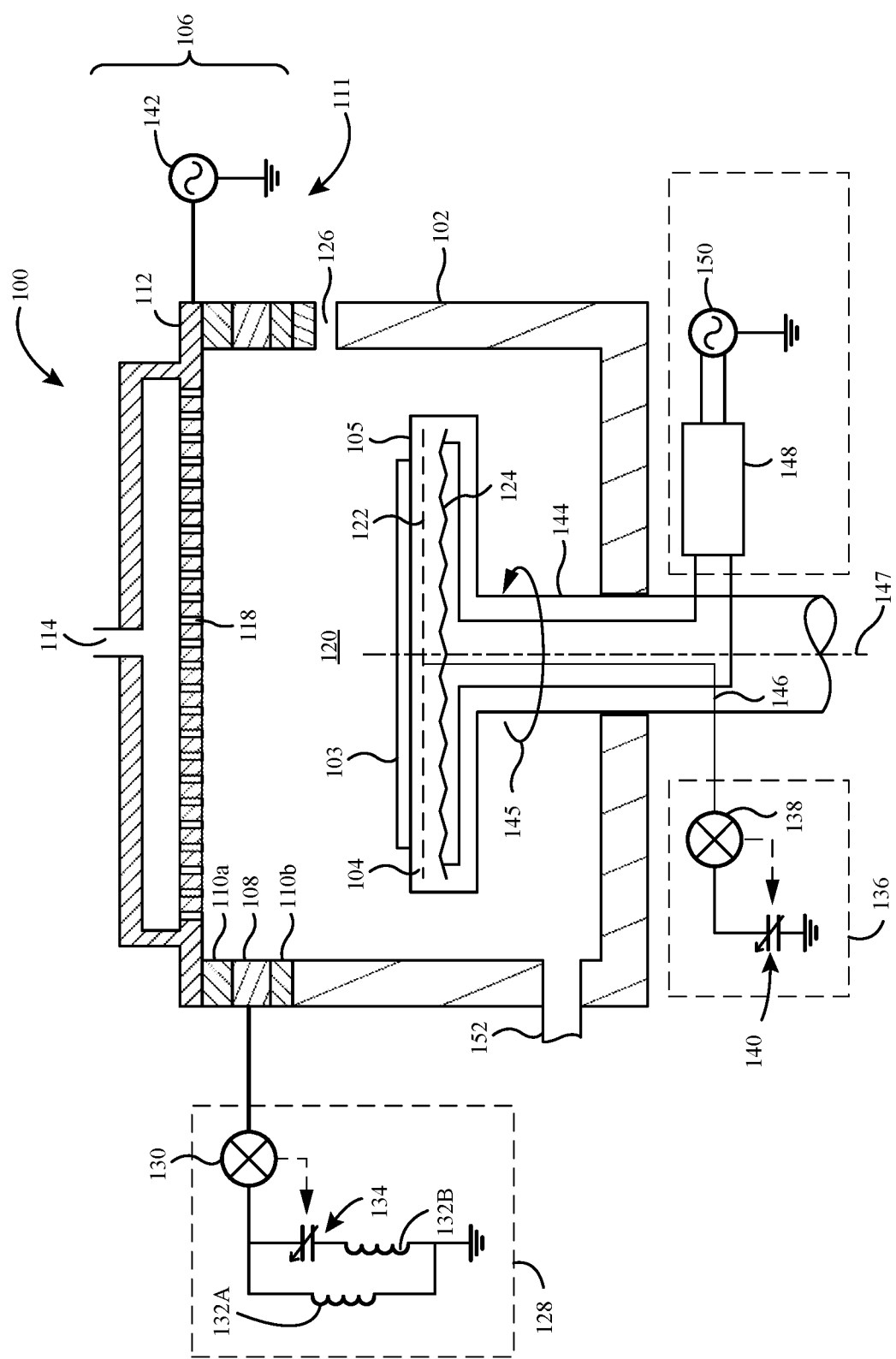
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. As device structures become more complex, maintaining or improving material characteristics becomes more important. Additionally, as helium supplies are consumed, the gas is becoming prohibitively expensive to use in plasma processing. Inert gases are often used in plasma generation to ensure proper plasma strike, and to control plasma shape and uniformity. Helium is often used as a gas in plasma generation because of a beneficial contribution to plasma as well as film properties. Despite these benefits, many processes are seeking to remove helium from use.

Conventional technologies have attempted to substitute helium use by using nitrogen or an increased amount of argon, although these gases provide additional challenges. For example, nitrogen may be incorporated within a deposited film, such as amorphous silicon, for example, which will change the material properties of the film. Argon tends to be a more energetic species than helium in a plasma environment, and thus, increasing a proportion of argon in the plasma precursors can cause increases in film roughness from the increased interaction at the film surface. As one non-limiting example, 3D NAND may utilize amorphous silicon as one of the alternating layers with oxide in the initial memory stack. As these memory structures may include hundreds of layers in material, surface roughness may propagate through the stack affecting the planarity of the layers. When memory holes are subsequently formed, the etch process may be incapable of maintaining uniformity in removal due to the roughness at interfaces that can affect etch uniformity. Accordingly, utilizing argon alone to facilitate plasma generation for silicon deposition may prevent use in 3D NAND stack formation.

The present technology may overcome these limitations by utilizing hydrogen along with argon and adjusting deposition parameters and materials to perform a surface treatment during the deposition. For example, the present technology may include etching exposed features of the film layer during deposition with hydrogen radical species. Additionally, hydrogen radicals may also react in gas phase with silicon-containing precursors and corresponding radicals, as well as the following reactions on the substrate. This may facilitate a more uniform surface profile, which may reduce or limit surface roughness during deposition. After describing general aspects of a chamber according to embodiments of the present technology in which plasma processing operations discussed below may be performed, specific methodology and component configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
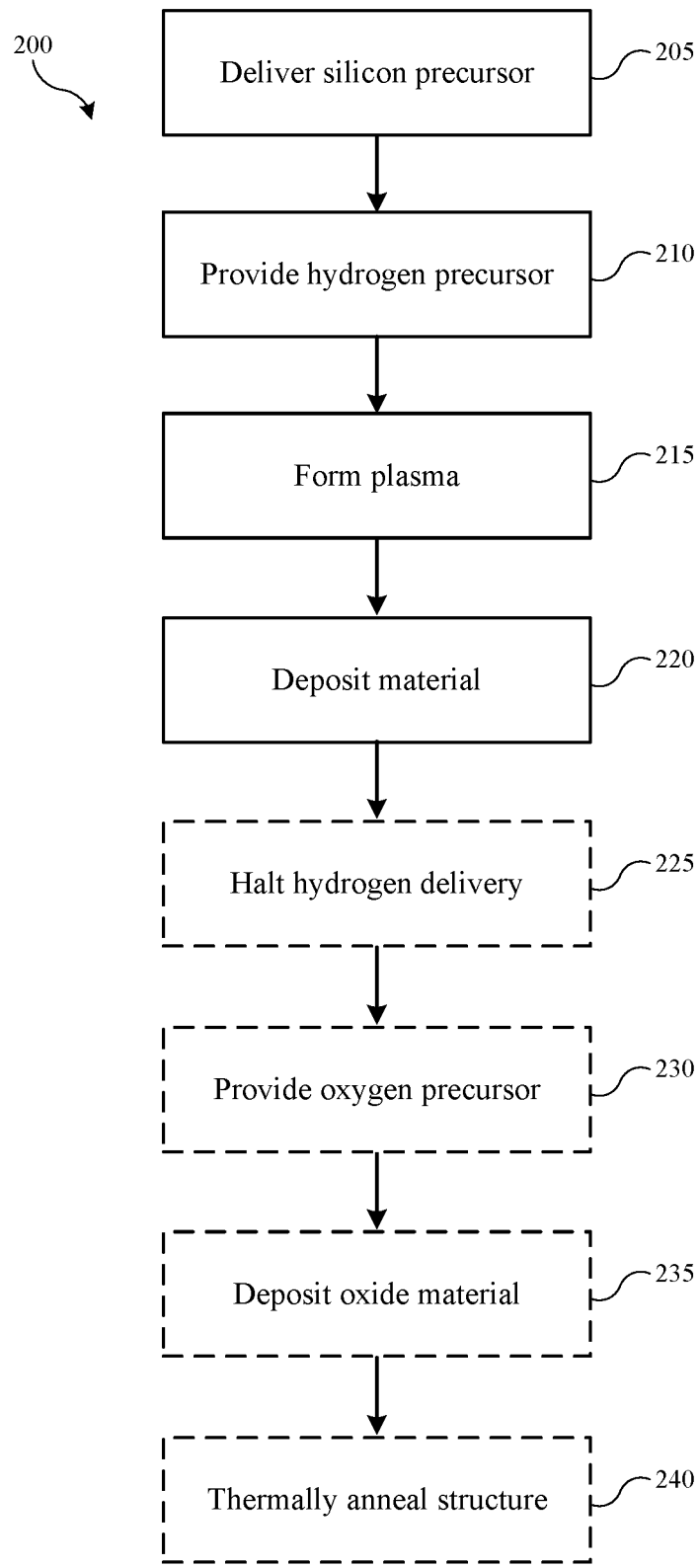
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

The substrate may be any number of materials on which deposition may be performed. The substrate may be or include silicon, germanium, dielectric materials including silicon oxide or silicon nitride, metal materials, or any number of combinations of these materials, which may be the substrate, or materials formed on the substrate. In some embodiments optional treatment operations, such as a pretreatment, may be performed to prepare a surface of substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, may be adsorbed, reacted, or formed on a surface of the substrate. Additionally, material removal may be performed, such as reduction of native oxides or etching of material, or any other operation that may prepare one or more exposed surfaces of the substrate for deposition.

At operation 205, one or more precursors may be delivered to the processing region of the chamber. For example, in exemplary embodiments in which an amorphous silicon film may be formed, a silicon-containing precursor may be delivered to the processing region of the processing chamber. Plasma enhanced deposition may be performed in some embodiments of the present technology, which may facilitate material reactions and deposition. With the silicon-containing precursor may be delivered one or more inert gases, such as argon, in one example, although the inert gases may not include helium in some embodiments of the present technology. For example, method 200 may include no delivery of helium during the method, and the processing region of the semiconductor processing chamber may be maintained free of helium or helium delivery during the method.

Some embodiments of the present technology may include additionally providing a hydrogen-containing precursor at operation 210, and which is provided with the silicon-containing precursor. The precursors delivered may all be used to form a plasma within the processing region of the semiconductor processing chamber at operation 215. At operation 220, a silicon-containing material may be deposited on the substrate. By incorporating a hydrogen-containing precursor in some embodiments, a controlled etch process may be induced during the deposition, which may reduce surface roughness during formation. For example, hydrogen may be a more reactive gas, and when plasma enhanced, the hydrogen radicals may terminate ligands and remove silicon-hydrogen bonds within the film being formed.

By incorporating an additional hydrogen source, a film modification, or profile etch may be performed simultaneously with the deposition of material. For example, through reaction and/or physical interaction with features being formed of the silicon-containing material, hydrogen-radicals may trim uneven formation so a more uniform profile of formation is being produced. To provide sufficient hydrogen radicals in the process, the hydrogen-containing precursor may be included at a greater flow rate than one or both of the silicon-containing precursor or the inert gas. For example, in some embodiments a flow rate ratio of the hydrogen-containing precursor to either or both of the silicon-containing precursor and/or the inert gas may be greater than or about 1:1, and in some embodiments may be greater than or about 2:1, greater than or about 3:1, greater than or about 4:1, greater than or about 5:1, greater than or about 6:1, greater than or about 8:1, greater than or about 10:1, greater than or about 15:1, greater than or about 20:1, greater than or about 25:1, greater than or about 30:1, greater than or about 35:1, greater than or about 40:1, greater than or about 45:1, greater than or about 50:1, or more. Although increasing the flow rate ratio of hydrogen to argon or inert gas may reduce film roughness, and embodiments may maintain a positive ratio of hydrogen to inert gas, as the ratio increases, film uniformity on the substrate may reduce as the etch process increases and based on flow profiles within the processing chamber. Accordingly, in some embodiments a flow rate ratio of hydrogen to inert gas may be maintained at less than or about 10:1, and may be maintained at less than or about 8:1, less than or about 6:1, less than or about 5:1, less than or about 4:1, less than or about 3:1, or less.

For example, depending on the precursors used, a silicon-containing precursor may be delivered at a flow rate less than or about 800 sccm, and may be delivered at a flow rate less than or about 750 sccm, less than or about 700 sccm, less than or about 650 sccm, less than or about 600 sccm, less than or about 550 sccm, less than or about 500 sccm, less than or about 450 sccm, less than or about 400 sccm, or less. Similarly, an inert gas may be delivered at a flow rate less than or about 2,000 sccm, and may be delivered at a flow rate less than or about 1,500 sccm, less than or about 1,200 sccm, less than or about 1,000 sccm, less than or about 800 sccm, less than or about 600 sccm, less than or about 500 sccm, less than or about 450 sccm, less than or about 400 sccm, less than or about 350 sccm, less than or about 300 sccm, less than or about 250 sccm, less than or about 200 sccm, or less. Any additional ranges within these ranges or as combinations of any stated or unstated number may also be used.

A hydrogen-containing precursor may be delivered at greater than or about 500 sccm, and may be delivered at a flow rate of greater than or about 700 sccm, greater than or about 900 sccm, greater than or about 1,000 sccm, greater than or about 1,100 sccm, greater than or about 1,200 sccm, greater than or about 1,300 sccm, greater than or about 1,400 sccm, greater than or about 1,500 sccm, greater than or about 1,600 sccm, greater than or about 1,700 sccm, greater than or about 1,800 sccm, greater than or about 1,900 sccm, greater than or about 2,000 sccm, or more. Increasing the hydrogen-containing precursor may further smooth the surface of the film being deposited, however, increased hydrogen incorporation may occur within the deposited film. Accordingly, in some embodiments, the hydrogen-containing precursor may be delivered at a flow rate of less than or about 3,000 sccm, and may be delivered at a flow rate of less than or about 2,800 sccm, less than or about 2,600 sccm, less than or about 2,400 sccm, less than or about 2,200 sccm, or less. Additionally, the silicon precursor may constitute less than 50% by volume of the entire precursor mix provided for the deposition, which may control stress and uniformity of the film being deposited. In some embodiments, the silicon-containing precursor may constitute less than 45% of volumetric flow of the total precursors, and may constitute less than or about 40%, less than or about 35%, less than or about 30%, less than or about 25%, less than or about 20%, less than or about 15%, or less.

The film may be deposited to any thickness on the substrate according to embodiments of the present technology, and some embodiments may include additional operations to generate additional layers of material, such as, for example, alternating layers of silicon and oxide for 3D NAND or other structural formation. When sufficient film growth has occurred, the process may be halted by extinguishing the plasma within the processing chamber, such as by halting power to a plasma-generating electrode, for example. However, by utilizing hydrogen instead of more conventional helium, interaction of hydrogen with subsequent oxidizing materials may occur, which may lead to the formation of particles that can cause increased defect contamination on the substrate. Accordingly, in some embodiments of the present technology where formation of a subsequent oxide layer may occur, the process may be performed to limit interaction between the hydrogen and the oxidizing precursor.

For example, subsequent sufficient deposition of silicon, method 200 may include halting delivery of the hydrogen at optional operation 225 prior to delivery of an oxidizing precursor. The plasma generation may also be halted, and in some embodiments one or more gas flows may continue, which may ensure hydrogen is exhausted from the processing chamber. After a period of time to ensure hydrogen removal, an oxygen-containing precursor may be delivered to the processing chamber at optional operation 230, along with one or more silicon-containing precursors and/or an inert gas, although the additional processing may similarly be performed without the delivery of helium as previously described for method 200. The oxygen-containing material may be or include diatomic oxygen, ozone, nitrous oxide, nitric oxide, or some other oxygen-containing precursor. A plasma may be formed of the precursors, and an oxide material may then be deposited at optional operation 235. The method up through operation 235, or including any additional operations, may be repeated one or more times, such as to produce a stack of alternating layers of material. The process of switching between the oxide formation and the silicon formation may similarly include a time to exhaust residual oxidizing material prior to delivering hydrogen to the chamber for the subsequent layer deposition.

As explained previously, helium may benefit deposition of amorphous silicon by reducing the film roughness. However, when helium is excluded, such as for the increased inclusion of argon as noted previously, an average roughness for the produced film may be greater than or about 0.5 nm, greater than or about 1.0 nm, or more, for a similar thickness film, although roughness may increase with increased film thickness. This may propagate throughout layers during multiple layer deposition, which may create a stack roughness of well over 1 nm. During subsequent etching operations, these larger disparities across the film may challenge etching operation uniformity, and may require additional operations to be performed, such as an additional chemical-mechanical polishing operation.

The present technology, however, may reduce or greatly reduce both the average roughness and the range of roughness of produced silicon-containing films by performing a substantially simultaneous etch utilizing additional hydrogen-containing precursor, or by performing one or more additional adjustments described further below. Additionally, the hydrogen radicals produced may also improve surface roughness conditions by interacting with silicon-containing precursors as previously stated. Films produced according to embodiments of the present technology may be characterized by an average roughness of the as-deposited film of less than or about 1.00 nm, and may be characterized by an average roughness of less than or about 0.90 nm, less than or about 0.80 nm, less than or about 0.70 nm, less than or about 0.60 nm, less than or about 0.50 nm, less than or about 0.45 nm, less than or about 0.40 nm, less than or about 0.35 nm, less than or about 0.30 nm, less than or about 0.25 nm, less than or about 0.20 nm, or less. Additionally, the roughness may be substantially controlled regardless of film thickness in some embodiments. This may allow avoidance of additional chemical-mechanical polishing operations, as the as-deposited film may be characterized by any of the average roughness ranges illustrated. Consequently, improved materials may be produced, which may afford film benefits over conventional materials and processes, as well as potentially reducing fabrication operations by limiting or reducing the number of polishing operations in a sequence.

Any number of precursors may be used with the present technology with regard to the silicon-containing precursor. For example, the silicon-containing precursor may include any silicon-containing material, such as organosilanes, which may include silane, disilane, and other materials. The hydrogen may be delivered as diatomic hydrogen, although any other hydrogen-containing precursor may be used in embodiments, although the produced film may include aspects of the additional materials. An inert gas may include one or more noble gases, including argon as noted above, or other gases that may have limited interaction or may not be incorporated within the film produced. Additional precursors may be or include materials to dope the silicon, such as phosphorus-containing precursors, arsenic-containing precursors, or any other material that may be included or used as a dopant for silicon, and which may alter one or more material properties of the film, including resistivity characteristics.

One or more additional aspects of the deposition may also be tuned to improve aspects of the deposition being performed. For example, the plasma power may impact the extent of hydrogen dissociation. Any number of hydrogen-containing precursors may be used, and in some embodiments diatomic hydrogen may be included. For some silicon-containing materials, the materials are sufficiently reactive at deposition temperatures that minimal plasma enhancement may be included. For example, some conventional technologies utilize a plasma power of less than or about 200 Watts, although this may be insufficient to adequately dissociate hydrogen in some embodiments. The present technology may utilize plasma power within a controlled range, which may facilitate hydrogen dissociation, and may increase hydrogen radicals, which may reduce roughness as previously explained. However, the power range may be limited to reduce bombardment energy, which can lead to increased roughness. Accordingly, in some embodiments the plasma power may be greater than or about 200 W, and may be greater than or about 225 W, greater than or about 250 W, greater than or about 275 W, greater than or about 300 W, greater than or about 325 W, greater than or about 350 W, greater than or about 375 W, greater than or about 400 W, or more. However, to limit increased physical interaction with the film that can increase roughness, the present technology may perform the deposition at plasma powers less than or about 500 W, less than or about 450 W, or less.

The temperatures of the substrate may additionally impact the deposition. For example, in some embodiments the substrate may be maintained at a temperature of greater than or about 400° C., and may be maintained at a temperature of greater than or about 420° C., greater than or about 440° C., greater than or about 460° C., greater than or about 480° C., greater than or about 500° C., greater than or about 520° C., greater than or about 540° C., greater than or about 560° C., greater than or about 580° C., or greater. By performing the deposition according to some embodiments of the present technology, hydrogen etching may be performed during the deposition to reduce roughness of the formed film. However, the amount of hydrogen radicals produced, such as with the enhanced plasma and delivery of hydrogen, may also increase an amount of hydrogen incorporation in the film produced. This may affect the stress within the film, although by simultaneously etching during the deposition, hydrogen incorporation may be reduced and a denser film may be formed. For example, an as-deposited film may be characterized by a stress of less than or about −200 MPa, less than or about −100 MPa, less than or about −50 MPa, or less, which may be based in part on the hydrogen incorporation. This may facilitate controlling substrate bow during subsequent processing in which the substrate may be exposed to a thermal environment.

For example, in some embodiments, method 200 may include exposing the substrate and silicon-containing material to a thermal environment, either through thermal anneal or subsequent high temperature processing the formed silicon-containing material at optional operation 240. While the deposition may be performed at a first temperature, the thermal anneal may be performed at a second temperature greater than the first. For example, the thermal anneal may be performed at a temperature greater than or about 480° C., and the thermal anneal may be performed at greater than or about 500° C., greater than or about 510° C., greater than or about 520° C., greater than or about 530° C., greater than or about 540° C., greater than or about 550° C., greater than or about 560° C., greater than or about 570° C., greater than or about 580° C., greater than or about 590° C., greater than or about 600° C., greater than or about 650° C., greater than or about 700° C., greater than or about 750° C., greater than or about 800° C., or higher. The thermal anneal may be performed for a period of time that may be greater than or about 0.5 minutes, and may be greater than or about 1 minute, greater than or about 2 minutes, greater than or about 3 minutes, greater than or about 4 minutes, greater than or about 5 minutes, greater than or about 6 minutes, or more. By utilizing hydrogen during the formation of the silicon-containing material, film shrinkage and stress change may be reduced compared to conventional processing. Accordingly, deposition of amorphous silicon and other silicon-containing materials may provide improved films characterized by more consistent film characteristics after exposure to high-temperature environments.

The pressure within the processing region may affect the amount of ionization and physical interaction performed during the deposition. By lowering a processing pressure, increased ion interaction may occur. Accordingly, in some embodiments a processing pressure during the deposition may be maintained at less than or about 50 Torr, and may be maintained at less than or about 40 Torr, less than or about 30 Torr, less than or about 20 Torr, less than or about 15 Torr, less than or about 10 Torr, less than or about 9 Torr, less than or about 8 Torr, less than or about 7 Torr, less than or about 6 Torr, less than or about 5 Torr, less than or about 4 Torr, less than or about 3 Torr, less than or about 2 Torr, or less. By performing deposition processes according to embodiments of the present technology, helium-free formation of amorphous silicon may be produced, while limiting increased film roughness characteristics of more conventional technologies.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
   delivering a silicon-containing precursor and an inert gas to a processing region of a semiconductor processing chamber;
   providing a hydrogen-containing precursor with the silicon-containing precursor and the inert gas;
   forming a plasma of all precursors within the processing region of the semiconductor processing chamber, wherein a plasma power is maintained at less than 450 W while forming the plasma of all precursors within the processing region of the semiconductor processing chamber; and
   depositing a silicon-containing material on a substrate disposed within the processing region of the semiconductor processing chamber, wherein the silicon-containing material is amorphous, wherein the processing region is maintained free of helium delivery during the deposition method, and wherein the silicon-containing material is characterized by an as-deposited surface roughness of less than or about 1.00 nm.

2. The deposition method of claim 1, wherein the silicon-containing material is characterized by an as-deposited surface roughness of less than or about 0.40 nm.

3. The deposition method of claim 1, wherein a substrate temperature is maintained at greater than or about 400° C. during the depositing the silicon-containing material on the substrate.

4. The deposition method of claim 1, wherein a pressure is maintained below or about 10 Torr during the depositing the silicon-containing material on the substrate.

5. The deposition method of claim 1, further comprising:
   forming a layer of silicon oxide over the silicon-containing material.

6. The deposition method of claim 5, further comprising:
   prior to forming the layer of silicon oxide over the silicon-containing material, halting a flow of the hydrogen-containing precursor.

7. The deposition method of claim 1, further comprising:
   subsequent the depositing, performing a thermal anneal of the silicon-containing material.

8. The deposition method of claim 7, wherein the thermal anneal comprises exposing the silicon-containing material to a temperature greater than or about 480° C. for a period of time greater than or about 0.5 minutes.

9. The deposition method of claim 1, wherein a flow rate ratio of the hydrogen-containing precursor to either of the silicon-containing precursor or the inert gas is greater than or about 1:1.

10. The deposition method of claim 1, wherein the silicon-containing precursor constitutes less than 50% by volume of an entire precursor mix provided for depositing the silicon-containing material.

11. A deposition method comprising:
    delivering a silicon-containing precursor and an inert gas to a processing region of a semiconductor processing chamber;
    providing a hydrogen-containing precursor with the silicon-containing precursor and the inert gas, wherein a flow rate ratio of the hydrogen-containing precursor to both of the silicon-containing precursor and the inert gas is greater than or about 5:1;
    forming a plasma of the silicon-containing precursor, the inert gas, and the hydrogen-containing precursor within the processing region of the semiconductor processing chamber; and
    depositing a silicon-containing material on a substrate disposed within the processing region of the semiconductor processing chamber, wherein the silicon-containing material is characterized by an as-deposited surface roughness of less than or about 1.00 nm.

12. The deposition method of claim 11, wherein the processing region is maintained free of helium delivery during the deposition method.

13. The deposition method of claim 11, wherein a plasma power is maintained at less than or about 500 W while forming the plasma of the silicon-containing precursor, the inert gas, and the hydrogen-containing precursor within the processing region of the semiconductor processing chamber.

14. The deposition method of claim 11, further comprising:
    subsequent the depositing, thermally annealing the silicon-containing material.

15. The deposition method of claim 11, wherein the silicon-containing material is characterized by an as-deposited surface roughness of less than or about 0.5 nm.

16. The deposition method of claim 11, further comprising:
    subsequent the depositing, forming a layer of a silicon oxide overlying the silicon-containing material.

17. The deposition method of claim 11, wherein a plasma power is maintained at greater than or about 200 W while forming the plasma of the silicon-containing precursor, the inert gas, and the hydrogen-containing precursor within the processing region of the semiconductor processing chamber.

18. A deposition method comprising:
    delivering a silicon-containing precursor and an inert gas to a processing region of a semiconductor processing chamber;
    providing a hydrogen-containing precursor with the silicon-containing precursor and the inert gas;
    forming a plasma of all precursors within the processing region of the semiconductor processing chamber at a plasma power of less than 450 W;
    depositing a silicon-containing material on a substrate disposed within the processing region of the semiconductor processing chamber, wherein the silicon-containing material is amorphous, wherein the processing region is maintained free of helium delivery during the deposition method, and wherein the silicon-containing material is characterized by an as-deposited surface roughness of less than or about 1.00 nm;
    halting a flow of the hydrogen-containing precursor while maintaining a flow of the silicon-containing precursor and/or a flow of the inert gas;
    providing an oxygen-containing precursor; and
    depositing an oxygen-containing material on the substrate.

19. The deposition method of claim 18, wherein a flow rate ratio of the hydrogen-containing precursor to either of the silicon-containing precursor or the inert gas is greater than or about 1:1.

20. The deposition method of claim 18, wherein a plasma power is maintained at less than 450 W while forming the plasma of all precursors within the processing region of the semiconductor processing chamber.

* * * * *